United States Patent [19]

Iwamatsu

[11] Patent Number: 4,576,851
[45] Date of Patent: Mar. 18, 1986

[54] SEMICONDUCTOR SUBSTRATE

[75] Inventor: Seiichi Iwamatsu, Suwa, Japan

[73] Assignee: Kabushiki Kaisha Suwa Seikosha, Nagano, Japan

[21] Appl. No.: 723,708

[22] Filed: Apr. 16, 1985

Related U.S. Application Data

[63] Continuation of Ser. No. 394,070, Jul. 1, 1982, abandoned.

[30] Foreign Application Priority Data

Jul. 2, 1981 [JP] Japan .............................. 56-104298
Jul. 24, 1981 [JP] Japan .............................. 56-116008

[51] Int. Cl.[4] .................. H01L 27/12; H01L 29/06; H01L 21/305; H01L 21/306
[52] U.S. Cl. ........................ 428/156; 29/576 B; 29/576 W; 29/580; 156/603; 156/649; 156/653; 156/657; 156/662; 357/49; 357/56; 427/86; 428/192; 428/446; 428/620
[58] Field of Search ............. 428/620, 621, 156, 157, 428/161, 170, 192, 446; 357/49, 52, 53, 54, 56; 148/1.5, 175; 29/571, 576 W, 580, 578, 576 B, 576 E; 427/86, 93; 156/649, 653, 657, 659.1, 662, 603, 617 R, 619, 622, DIG. 102, DIG. 103

[56] References Cited

U.S. PATENT DOCUMENTS

| | | | |
|---|---|---|---|
| 3,375,418 | 3/1968 | Garnache et al. | 427/86 X |
| 3,649,386 | 3/1972 | Murphy | 29/578 X |
| 3,740,280 | 6/1973 | Ronen | 156/650 X |
| 3,743,552 | 7/1973 | Fa | 156/655 X |
| 3,789,276 | 1/1974 | Sivertsen | 357/49 |
| 3,929,529 | 12/1975 | Poponiak | 156/662 X |
| 4,252,581 | 2/1981 | Anantha et al. | 427/86 X |
| 4,378,627 | 4/1983 | Jambotkar | 156/653 X |
| 4,462,847 | 7/1984 | Thompson et al. | 29/576 W |
| 4,487,639 | 12/1984 | Lam et al. | 29/576 W |

*Primary Examiner*—William A. Powell
*Attorney, Agent, or Firm*—Blum Kaplan Friedman Silberman & Beran

[57] ABSTRACT

A semiconductor substrate including a single-crystal mono-crystalline film on an insulating film and methods of fabrication are provided. The insulating film has an opening to expose the single-crystal material to a polycrystalline or amorphous semiconductor layer on the insulating film for growing mono-crystals upon application of heat slightly less than the melting point of the semiconductor and applying an energy beam, such as an electron beam or light beam to the semiconductor film. The semiconductor-insulator-semiconductor provides improved substitutes for Silicon On Sapphire formed by the epitaxial method.

8 Claims, 4 Drawing Figures

SEMICONDUCTOR SUBSTRATE

This is a continuation of application Ser. No. 394,070, filed July 1, 1982, now abandoned.

BACKGROUND OF THE INVENTION

This invention relates to a semiconductor substrate, and in particular a mono-crystalline semiconductor plate-insulating film-mono-crystalline semiconductor film wherein the insulating film is formed with an opening and mono-crystalline semiconductor film is formed in the opening and on the insulating film.

There has been recent interest in growing single-crystal silicon films over insulating layers on silicon substrates as a substitute for Silicon On Sapphire substrates which are expensive. Additionally, methods for fabricating such devices can be utilized for fabrication of devices incorporating multiple isolated semiconductor layers. One such technique for preparing this type of substrate appeared in John C. C. Fan, M. W. Geis, and Bor-Yeu Tsaur, Appl. Phys. Lett. 38,(5), 365 (1981), wherein the authors have reported growing single-crystal silicon films over insulating layers on silicon substrates. According to this method, at the opening portion, or window, there is a step gap between the surface of the mono-crystalline semiconductive film on the semiconductive plate and a surface of the mono-crystalline semiconductor film on the insulating film. This same step gap is also formed in the mono-crystalline semiconductor film. Thus, a problem arises in that wiring formed at the window portion is easily damaged due to the step gap.

In these cases the conventional construction is not fully satisfactory in that parasitic capacitance which forms between the semiconductor device and the mono-crystalline semiconductor substrate cannot be reduced due to the necessarily thin insulating film. On the other hand, if the thickness of the insulating film is increased in order to reduce the parasitic capacitance effect, the step gap is larger. Such a large step gap tends to damage wires formed at the step gap.

The conventional manufacturing method of providing a monocrystalline semiconductor layer on an insulator is to provide a silicon semiconductor layer on a mono-crystalline sapphire substrate. This device is generally represented as SOS (Silicon On Sapphire) formed by the epitaxial method. However, in conventional techniques, there is no crystal surface wherein the lattice constant of the mono-crystalline sapphire substrate coincides with the lattice constant of the grown silicon mono-crystalline layer. The difference in lattice constant is within at least several percent at best. Thus, substantial crystal defects exist in the silicon mono-crystalline layer. Additionally, as such sapphire substrates are expensive, practical use of such substrates have been restrained. This is the case in spite of the increasing demand for manufacturing high-speed semiconductor devices, utilizes a mono-crystalline semiconductor layer on an insulator.

Accordingly, it would be desirable to provide a semiconductor substrate and a method of preparing the semiconductor substrate which would satisfy these needs and overcome the problems encountered in the prior art.

SUMMARY OF THE INVENTION

Generally speaking, in accordance with the invention, a semiconductor substrate including a semiconductor base or plate having a projecting region and an insulating film having a window opening formed on the semiconductor plate with the projecting semiconductor region in the window opening and a mono-crystalline semiconductor film formed on the insulating film is provided. The semiconductor substrate is characterized in that the surface of the semiconductor material in the window opening is at substantially the same level as the surface of the insulating film. This flat surface of the semiconductor substrate avoids breaking of wiring at step gaps of window openings and provides a highly reliable substrate having minimal parasitic capacitance.

Semiconductor substrates in accordance with the invention may be prepared by forming an insulator mask to correspond to the window opening on a mono-crystalline semiconductor plate or base and removing mono-crystalline semiconductor plate material by etching in the unmasked region. An insulator film is deposed on the etched region and the mask removed leaving the surface of the insulator film and the semiconductor material in the window opening substantially the same. A poly-crystalline or amorphous semiconductor material is deposited on the insulating film and energy beams are applied to the surface for forming the mono-crystalline semiconductor film in which crystal growth is seeded by the mono-crystalline semiconductor material at the window opening in the insulating film. In an alternative embodiment of the invention, a window may be etched through an insulating film formed on a mono-crystalline semiconductor plate and semiconductor disposed within the window opening. Semiconductor material is then disposed across the surface of the insulating film and the semiconductor material in the window. Energy beam application causes the mono-crystalline semiconductor film to be seeded by the mono-crystalline semiconductor material of the plate.

In another embodiment of the invention a mono-crystalline layer is formed by providing a first solid layer, a seed for growing mono-crystals which is provided on a portion of the first solid layer and a second solid layer of poly-crystalline or amorphous semiconductor material which is in contact with at least a portion of the seed for growing mono-crystals and it covers the first solid layer, the second solid layer mono-crystalized by elevating the temperature of the first solid layer to slightly less than the melting point of the second solid layer and applying energy beams, such as an electron beam or light beam to the second solid layer and scanning the energy beam from a contact point of the seed with the second solid layer across the second solid layer and repeating the melting and cooling for forming the mono-crystalline layer.

Accordingly, it is an object of the invention to provide an improved semiconductor substrate.

It is another object of this invention to provide an improved semiconductor substrate including a semiconductor film on an insulating film.

Another object of the invention is to provide an improved semiconductor substrate which includes an insulating film having a window opening on a semiconductor plate and semiconductor material in the window opening and across the surface of the insulating film.

It is another object of the invention to provide an improved semiconductor substrate including an insulating film having an opening therethrough formed on a mono-crystalline silicon semiconductor plate with a mono-crystalline semiconductor film formed in the window opening and on the surface of the insulating film.

Still a further object of the invention is to provide a method for preparing a semiconductor substrate which includes an insulating film having a window opening on a semiconductor plate and a semiconductor material in the window opening and across the surface of the insulating film.

Yet another object of the invention is to provide a method for forming the semiconductor substrate by etching the semiconductor plate in the region other than the window opening in the insulating film.

It is another object of the invention to provide an improved method of preparing the semiconductor substrate wherein the window opening is formed in the insulating film by etching.

Yet a further object of the invention is to provide a method for forming the semiconductor substrate by providing a seed for growing mono-crystals in contact with a solid layer which is mono-crystalized by raising the temperature and applying an energy beam to the layer to be mono-crystalized.

Sill other objects and advantages of the invention will in part be obvious and will in part be apparent from the specification.

The invention accordingly comprises the several steps and the relation of one or more of such steps with respect to each of the others, and the article possessing the features, properties, and the relation of elements, which are exemplified in the following detailed disclosures, and the scope of the invention will be indicated in the claims.

BRIEF DESCRIPTION OF THE DRAWINGS

For a fuller understanding of the invention, reference is had to the following description taken in connection with the accompanying drawings, in which.

DETAILED DESCRIPTION OF THE PREFERRED EMBODIMENTS

FIGS. 1(a)–(e) illustrate the steps in manufacturing a semiconductor substrate in accordance with the invention. Each figure is a sectional view of the semiconductor in a particular step in the process.

Figure 1:
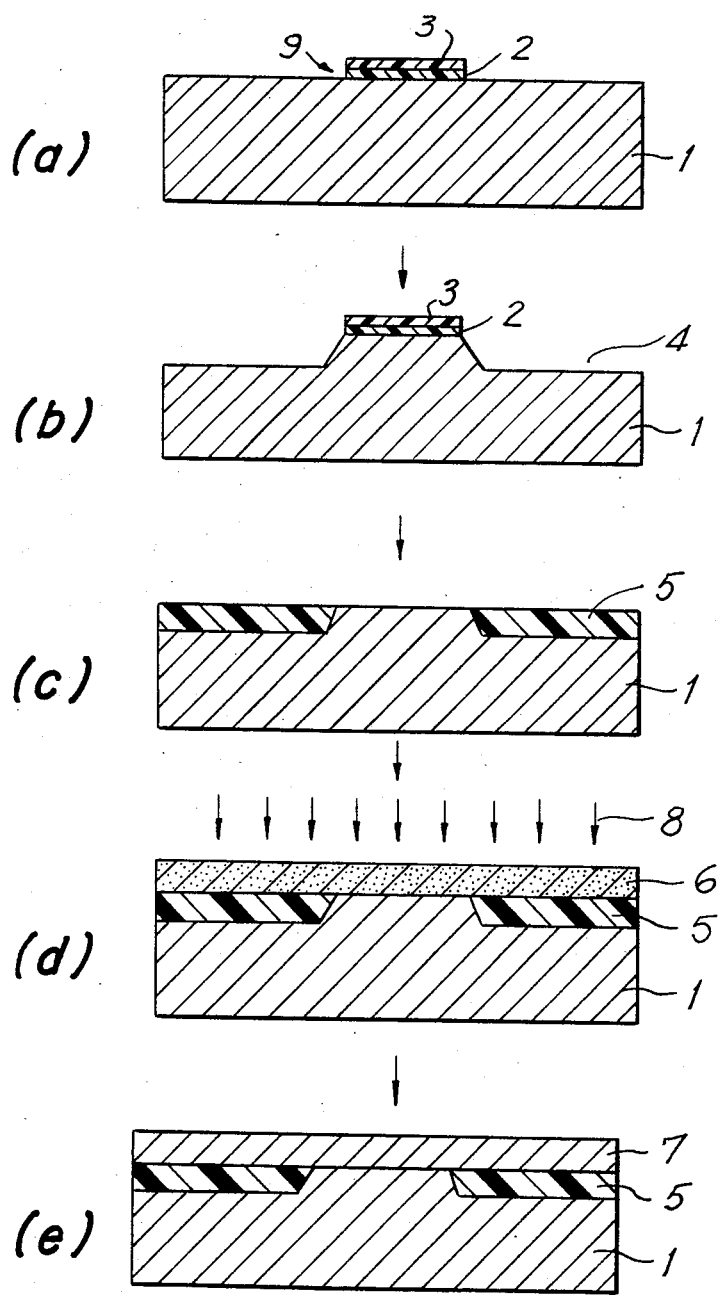
FIGS. 1(a)–(e) are sectional views illustrating steps in a manufacturing process for preparing semiconductor devices in accordance with the invention.

FIG. 1(a) illustrates a mono-crystalline semiconductor base or plate 1, such as silicon for example, and an $SiO_2$ film 2 of about 0.5$\mu$ thickness formed on the surface thereof. An additional insulator film 3 of $Si_3N_4$ is formed on $SiO_2$ film 2 by chemical vapor deposition (CVD) method. $SiO_2$ film 2 and $Si_3N_4$ film 3, except in a region 9 corresponding to a window-opening which will be explained in more detail below, are removed by photo-etching. Thus, only a portion of $SiO_2$ film 2 and $Si_3N_4$ film 3 remain at region 9 as illustrated in FIG. 1(a).

Mono-crystalline semiconductor plate 1 is etched to a depth of about 1$\mu$ throughout by anisotropic etching utilizing a KOH solution. As shown in FIG. 1(b) $SiO_2$ film 2 and $Si_3N_4$ film 3 serve as a mask for forming a groove 4 about mask region 9. An insulating film 5, such as $SiO_2$ is formed in groove 4 to about the same level as the surface of semiconductor plate 1 by thermal oxidation again utilizing $SiO_2$ film 2 and $Si_3N_4$ film 3 as a mask. $SiO_2$ film 2 and $Si_3N_4$ are then eliminated resulting in the construction as illustrated in FIG. 1(c).

A 0.5$\mu$ thick silicon film 6 in a polycrystalline or amorphous state is formed on the surface of plate 1 by, for example, CVD. An energy beam, indicated by arrows 8, such as heat or light is applied to the surface of silicon film 6 in order to heat substrate to a temperature of about 1200° C. at the surface. At this time silicon film 6 melts. Silicon film 6 is cooled to form a mono-crystalline semiconductor layer 7 as shown in FIG. 1(e).

FIGS. 2(a)–(d) illustrate another embodiment of the invention for manufacturing a semiconductor substrate in accordance with the invention. Each Figure is a sectional view of a different step of the semiconductor in the manufacturing process.

An insulating film 12, such as silicon dioxide or the like of about 1$\mu$ in thickness is formed on a mono-crystalline semiconductor substrate 11, such as silicon, by thermal oxidation. A portion of insulating film 12 is removed by photo-etching to form a window opening 16. A first mono-crystalline semiconductor film 13 is embedded in window opening 16 by the epitaxial method. The surface of embedded mono-crystal semiconductor film 13 is substantially the same level as the surface of insulating film 12.

Figure 2:
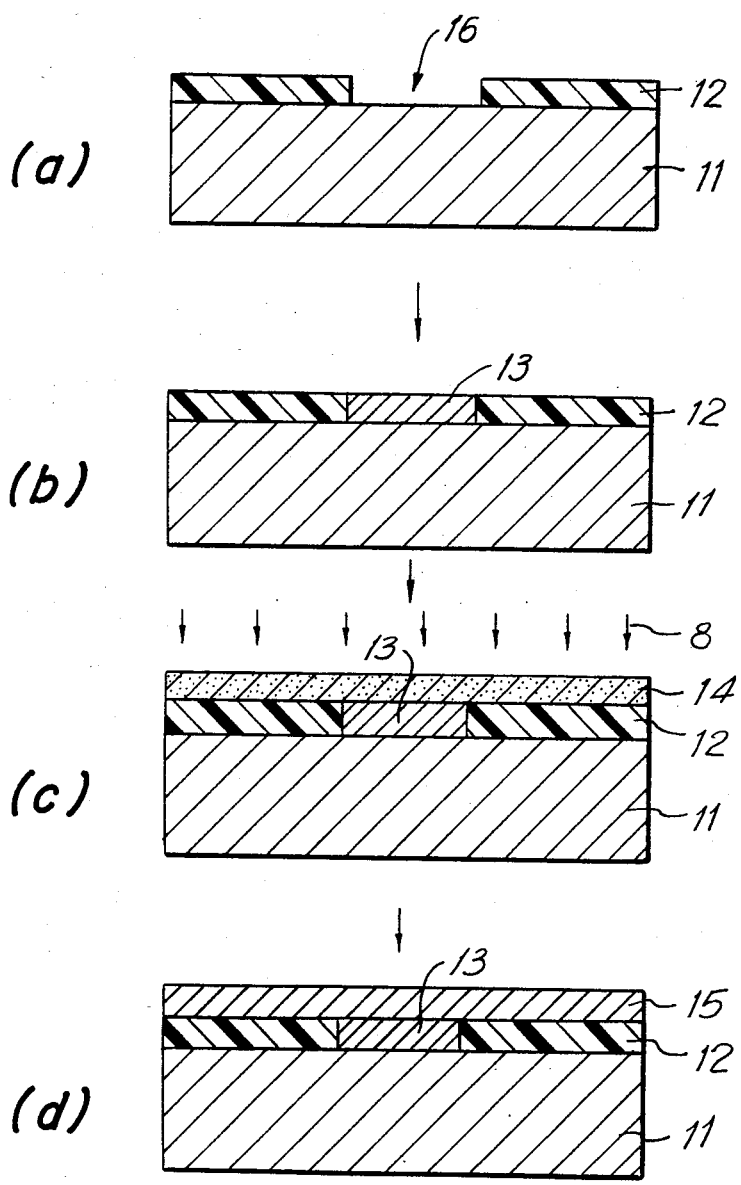
FIGS. 2(a)–(d) are sectional views illustrating the steps in a manufacturing process for preparing semiconductor devices in accordance with another embodiment of the invention.

A 0.5$\mu$ thick silicon film 14 in the polycrystalline or amorphous state is formed across the surface of insulating film 12 and embedded mono-crystalline semiconductor film 13 on the substrate 11 by CVD. Energy beams 8, such as heat rays or light rays are applied to the surface of silicon film 14 wherein plate 11 is heated to a surface temperature of about 1200° C. for melting silicon film 14. A mono-crystalline semiconductor film 15 is formed by cooling melted silicon film 14 as illustrated in FIG. 2(d).

In accordance with these embodiments of the invention, a semiconductor substrate including an insulating film having a window opening therethrough disposed on a semiconductor plate with semiconductor film formed in the window opening and across the insulating film. Such a construction is advantageous in that parasitic capacitance between the semiconductor plate and the semiconductor device can be reduced due to the thick insulating film when the semiconductor device is formed on the substrate. This permits obtaining a semiconductor device having high speed response characteristics. In addition, the breaking of wiring of the semiconductor device at the conventional step gaps formed at the window opening the regions is avoided as the semiconductor substrate has a flat surface. Accordingly, highly reliable and a high yield rate semiconductor device can be provided in accordance with this embodiment of the invention.

Figure 3:
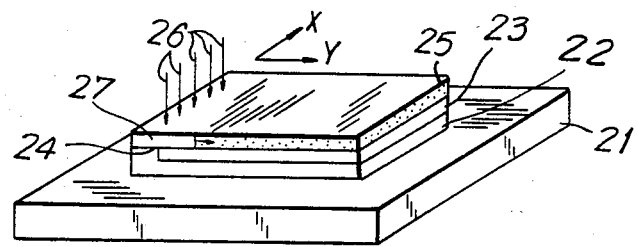
FIG. 3 is a prespective view of a mono-crystalline layer prepared in accordance with one of the embodiments of the invention.

Referring now to FIG. 3, a prespective view of a semiconductor substrate with a mono-crystalline semiconductor layer is formed in accordance with a further embodiment of the invention is shown. In accordance with this method of forming a mono-crystalline layer, a carbon heater 21 is maintained at a temperature between about 1200° C. and 1300° C. by electrical heating. A sample of a silicon plate 22 is placed on carbon heater 21. Most of the surface of silicon plate 22 is covered with an insulation layer 23, which is a single layer structure formed of a single layer of $SiO_2$ or $Si_3N_4$. Alternatively, insulation layer 23 may be formed of a two-layer structure including an $SiO_2$ layer and an $Si_3N_4$ layer. A portion of insulation layer 23 is removed etching to expose the surface of lower Si plate 22.

The exposed portion of Si plate 22 is to become a seed portion 24 for growing a single-crystal layer across insulation layer 23. A poly-crystalline silicon layer 25 is formed across the surface of insulation film 23 by the CVD method. Energy beams 26, such as electron rays or laser rays are linearly irradiated across poly-crystalline silicon layer 25 in the X direction to seed portion 24 for growing a mono-crystal 24. Energy beams 26 are then displaced in the Y direction wherein partial meling of poly-crystalline silicon layer 25 occurs at about 1400° C. A portion of melted poly-crystalline silicon 27 becomes a mono-crystalized region as energy beams 26 are no longer irradiated thereon and the cooling process commences in the Y direction. Thus, poly-crystalline silicon layer 25 becomes a mono-crystalline silicon layer across the surface of insulating layer 23.

Figure 4:
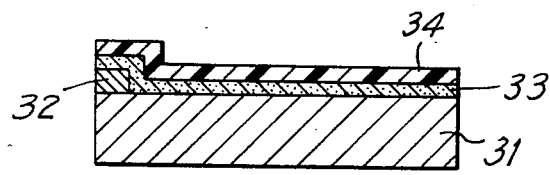
FIG. 4 is a sectional view of the structure of a semiconductor substrate as illustrated in FIG. 3.

FIG. 4 illustrates a type of substrate which may be prepared by utilizing the mono-crystalline layer formed on the insulating film in accordance with this embodiment of the invention. A mono-crystalline silicon film 32 which is the seed crystal for growing a mono-crystalline layer is disposed on or in the surface of a substrate plate or insulating base formed of a quartz glass or ceramic material. Mono-crystalline silicon 32 adheres to insulating base 31 by utilizing a coating glass or a CVD poly-crystal silicon layer 33. A $SiO_2$ layer 34 is deposited on poly-crystalline silicon layer 33 by CVD.

In accordance with this embodiment, advantageous results are obtained in that a device without crystal defects results since the mono-crystalline silicon on the insulator becomes a complete mono-crystalline silicon film having the perfect structure for seeding the growth. Additionally, the substrate in accordance with this embodiment of the invention can be prepared at substantially cost savings compared with a sapphire substrate and is suitable for manufacturing high-speed semiconductor devices.

It will thus be seen that the objects set forth above, among those made apparent from the preceding description, are efficiently attained and, since certain changes may be made in carrying out the above method and in the constructions set forth above without departing from the spirit and scope of the invention, it is intended that all matter contained in the above description and shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

What is claimed is:

1. A semiconductor substrate, comprising a single-crystal semiconductor material having a planar surface and an island of the semiconductor material projecting from the surface forming a projecting region at an edge of said semiconductor material and an insulating film having an opening for cooperating with the projecting region to form a smooth surface with the top of the projecting semiconductor material at substantially the same level as the surface of the remainder of the insulating film and a single-crystal semiconductor film across the top of the projecting region and the insulating film.

2. The semiconductor substrate of claim 1, wherein the projecting region is integrally formed from the semiconductor material.

3. The semiconductor substrate of claim 1, further including a base, the projecting region formed on the base and the insulating film formed on the base.

4. The semiconductor substrate of claim 3, wherein the base is a single-crystal semiconductor material in contact with the projecting region of a single-crystal semiconductor material.

5. The semiconductor substrate of claim 3, wherein the base is an insulating substrate and the projection region of single-crystal semiconductor material is a seed material.

6. The semiconductor substrate of claims 4 or 5, wherein the projecting semiconductor material is a single-crystal silicon and the insulating film is one of an $SiO_2$ film an $Si_3N_4$ film and a combination of one layer of $SiO_2$ and one layer of $Si_3N_4$.

7. A semiconductor substrate, comprising an insulating plate, a projecting region of single-crystal semiconductor material disposed on the plate at the edge thereof a single-crystal semiconductor film across the surface of the projecting region and the insulating substrate, and an insulating film on the single-crystal semiconductor film.

8. The semiconductor substrate of claim 7, wherein the projecting semiconductor material is a single-crystal silicon and the insulating film is one of an $SiO_2$ film an $Si_3N_4$ film and a combination of one layer of $SiO_2$ and one layer of $Si_3N_4$.

* * * * *